United States Patent [19]

Wilhelm

[11] Patent Number: 4,641,283
[45] Date of Patent: Feb. 3, 1987

[54] CIRCUIT FOR READING BIPOLAR STORAGE CELLS

[75] Inventor: Wilhelm Wilhelm, Munich, Fed. Rep. of Germany

[73] Assignee: Siemens Aktiengesellschaft, Berlin and Munich, Fed. Rep. of Germany

[21] Appl. No.: 514,190

[22] Filed: Jul. 15, 1983

[30] Foreign Application Priority Data

Jul. 20, 1982 [DE] Fed. Rep. of Germany ....... 3227121

[51] Int. Cl.[4] .......................................... G11C 11/40
[52] U.S. Cl. ................................ 365/190; 365/155; 365/156; 365/207
[58] Field of Search ............... 365/190, 155, 156, 207, 365/208, 179

[56] References Cited

U.S. PATENT DOCUMENTS

| | | | |
|---|---|---|---|
| 4,204,276 | 5/1980 | Glock et al. | 365/189 |
| 4,348,747 | 9/1982 | Takahasi | 365/155 |
| 4,409,674 | 10/1983 | Takahashi | 365/190 |
| 4,456,979 | 6/1984 | Isogai | 365/190 |
| 4,459,686 | 7/1984 | Toyoda | 365/155 |

OTHER PUBLICATIONS

Kawarada et al., "A Fast 7.5ng Access 1K-Bit RAM for Cache-Memory Systems," Oct. 78, vol. SC-13, No. 5, pp. 656-663.

*Primary Examiner*—Terrell W. Fears
*Attorney, Agent, or Firm*—Herbert L. Lerner; Laurence A. Greenberg

[57] ABSTRACT

A circuit for reading bipolar storage cells includes a storage element formed of two fed-back inverters, each of the inverters being formed of a multi-emitter transistor and a load element connected to a respective one of the multi-emitter transistors, two complementary bit-lines each being connected to one emitter of a respective one of the multi-emitter transistors, a first potential source, two bit-line current sources each being connected between the first potential source and a respective one of the complimentary bit-lines, a differential amplifier having two inputs, two read transistors each having a collector-emitter path connected between a respective one of the inputs of the differential amplifier and a respective one of the complimentary bit-lines, a second potential source, a read-current source connected to the second potential source, and two diode paths each connected between the read-current source and a respective one of the complimentary bit-lines.

3 Claims, 4 Drawing Figures

CIRCUIT FOR READING BIPOLAR STORAGE CELLS

The invention relates to a circuit for reading bipolar storage cells, including a storage element formed of two fed-back inverters, each inverter being formed of a multi-emitter transistor and a load element, two complementary bit lines each being connected to an emitter of one of the two multi-emitter transistors and each being connectible through a bit-line current source to a first potential, and a differential amplifier having inputs connected through collector-emitter paths of read transistors to the complementary bit lines.

Circuits of this type are known, for instance, from the article by K. Kawarada et al, in IEEE Journal of Solid State Circuits, Vol. SC-13 No. 5, Oct. 1978, Pages 656 to 663, the article by U. Bürker and H. Glock, in IEEE International Solid-State Circuit Conference 1979, Pages 102 and 103 and EP-A1-019988 (particularly FIG. 2). The reading process in the conventional circuits is based on interrogating the storage cell potentials with respect to a fixed reference potential.

The information of a storage element formed by two fed-back inverters is contained in the polarity of the cross coupling difference voltage of a storage element. In order to obtain an unambiguous reading voltage, the reference potential must be exactly between the potentials of the cross coupling difference. Since the cross coupling potentials depend on a number of parameters which are subject to spread, temperature and supply influences, it is difficult or even impossible to find the correct reference potential. In the prior art circuits, an attempt is made to circumvent these difficulties by providing a cross potential difference which is as large as possible. However, this procedure has several disadvantages:

1. The magnitude of the bit line excursions is several hundred mW. This leads to an increase of the access time since the charge reversal of the line which is heavily capacitively loaded, takes time.
2. In the transition region (i.e. when changing addresses), when two cells relieve each other, the reading signal is not unambiguous.
3. Accurate tolerance calculations and possibly several attempts at adjustment by reconstruction, are necessary in order to develop reproducible memory modules.
4. The full bit line current flows into the storage cell which is constructed with the smallest structures to save space, and overloads it.

It is accordingly an object of the invention to provide a circuit for reading bipolar storage cells, which overcomes the herein-afore-mentioned disadvantages of the heretofore-known devices of this general type, in which parameter spread errors are reduced and the signal excursions are reduced.

With the foregoing and other objects in view there is provided, in accordance with the invention, a circuit for reading bipolar storage cells, comprising a storage element formed of two fed-back inverters, each of the inverters being formed of a multi-emitter transistor and a load element connected to a respective one of the multi-emitter transistors, two complementary bit-lines each being connected to one emitter of a respective one of the multi-emitter transistors, a first potential source, two bit-line current sources each being connectible between the first potential source and a respective one of the complementary bit-lines, a differential amplifier having two inputs, two read transistors each having a collector-emitter path connected between a respective one of the inputs of the differential amplifier and a respective one of the complementary bit-lines, a second potential source, a read-current source connected to the second potential source, and two diode paths each connected between the read-current source and a respective one of the complementary bit-lines. It is therefore possible to dispense with a fixed reference voltage and to interrogate only difference potentials. Parameter spread errors are reduced and signal excursions are reduced.

In accordance with another feature of the invention, there are provided two resistance elements each being connected to the collector terminal or in the collector circuit, of a respective one of the read transistors.

In accordance with a further feature of the invention, the read-current source is connected to the base terminals of the read transistors, and the diode paths connected between the read-current source and the bit-lines are the base-emitter paths of the read transistors.

In accordance with an added feature of the invention, there are provided two resistance elements each being connected between the base and collector terminals of a respective one of the read transistors.

In accordance with an additional feature of the invention, there are provided two resistance elements each being connected between the read-current source and the collector terminal of a respective one of the read transistors.

In accordance with again another feature of the invention, $0.5 \times I < I_A < I$, wherein $I_A$ is the current of the read current source, and I is the sum of the currents of the bit-line currents sources.

In accordance with a concomitant feature of the invention, the read-current source includes:

a first series circuit of a first resistor connected to the second potential source, a diode, the collector-emitter path of a first transistor, a second resistor, and a first constant-current source connected to the first potential source;

a second series circuit of a third resistor connected to the second potential source, and a second constant-current source connected to the first potential source;

a second transistor having a collector terminal connected to the second potential source, an emitter terminal connected to the base terminal of the first transistor, and a base terminal connected to a junction point between the third resistor and the second constant-current source; and a third transistor having a collector terminal connected to the emitter terminal of the second transistor, an emitter terminal connected to a junction point between the second resistor and the first constant current source, and a base terminal connected to a junction point between the diode and the collector terminal of the first transistor;

the first resistor and the diode having a junction point therebetween forming a read-current output of the read-current source; and the first, second and third transistors all having the same conductivity or conduction type.

Other features which are considered as characteristic for the invention are set forth in the appended claims.

Although the invention is illustrated and described herein as embodied in a circuit for reading bipolar storage cells, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

Figure 1:
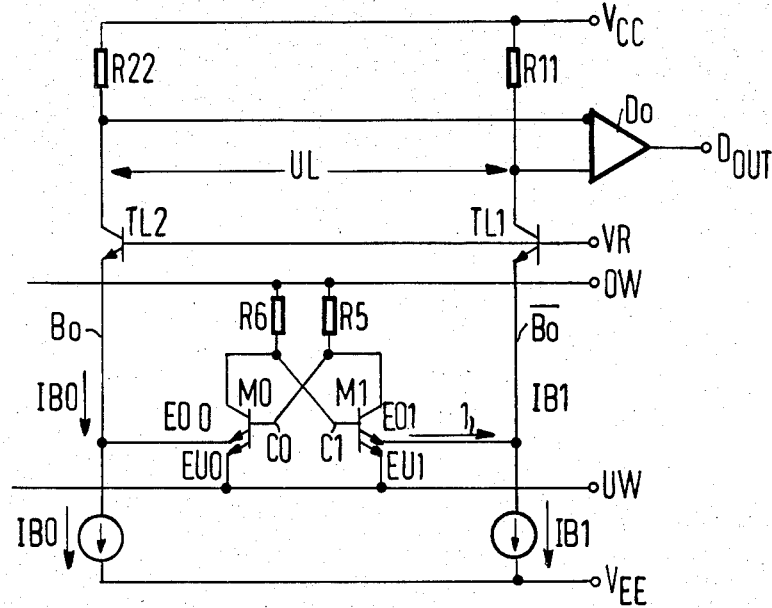
FIG. 1 is a schematic circuit diagram of the basic circuit for the information interrogation of a cell embedded in a memory matrix, according to the state of the art.

Referring now to the figures of the drawing in which like elements are designated with the same reference symbols, and first particularly to FIG. 1 thereof, there is seen a storage cell with a corresponding read circuit, such as is known from the state of the art, for instance in the references cited above. For reasons of clarity, only one storage element of a memory matrix is shown in FIG. 1. The storage element is formed of two fedback inverters, the first inverter being formed by a load element R6 and a multi-emitter transistor M0, and the second inverter being formed by a load element R5 and a multi-emitter transistor M1. The two multi-emitter transistors M0 and M1 are cross-coupled and the two inverters therefore form a flip-flop.

The two multi-emitter transistors M0 and M1 each have two emitters EO0, EU0 and EO1, EU1, respectively, wherein one emitter EO0 and EO1 of each respective multi-emitter M0 and M1 is connected to a respective bit line Bo and $\overline{Bo}$, while the second emitters EU0 and EU1 are connected to a lower word line UW.

The storage element located on one hand between an upper word line OW and the lower word line UW, through which a constant current flows from a non-illustrated current source, and on the other hand the storage element is located between the bit-line pair Bo and $\overline{Bo}$. The upper word line OW can be selected through a non-illustrated word line decoder, while the bit-line pair Bo and $\overline{Bo}$ can be selected through a non-illustrated bit-line decoder. If the bit lines Bo and $\overline{Bo}$ are selected, constant-current sources IB0 and IB1 which connect the bit lines Bo and $\overline{Bo}$ to a first potential $V_{EE}$, are switched on.

The evaluation circuit according to the state of the art is formed of two read transistors TL1 and TL2, the base electrodes of which are connected to a reference voltage VR. The emitters of the transistors TL1, TL2 are connected to the bit lines $\overline{Bo}$ and Bo, respectively. The collectors of the read transistors TL1, TL2 are connected on one hand through respective resistors R11, R22, to a second potential (supply voltage) $V_{cc}$, and on the other hand they are each connected to a respective input of a differential amplifier Do. An output $D_{out}$ of the amplifier Do supplies the read-out data bit.

The reading process in conventional bipolar memories is based on interrogating the cell potentials with respect to the fixed reference potential VR. The information of the storage element is contained in the sign of the cross coupling difference voltage C1−C0 of the cell, wherein C1 designates the voltage present at the base of the multi-emitter transistor M1, and C0 designates the voltage present at the base of the multi-emitter transistor M0.

In order to arrive at an unambiguous read voltage UL between the inputs of the differential amplifier Do, the reference potential VR must lie exactly between the potentials C1 and C0. For example, for reading a "1", the potential C1 must be higher than the reference potential VR, so that the storage element takes over the bit line current IB1 which then flows through the emitter EO1 of the multi-emitter transistor M1 according to an arrow 1. At the same time, the potential C0 must be lower than the reference potential VR, so that the read transistor TL2 carries the bit-line current IB0 to the read resistor R22. However, when a "0" is read, the potential C1 must be lower than the reference potential VR, so that the bit-line current IB1 of the bit line $\overline{Bo}$ does not flow through the storage element, but through the read transistor TL1 to the read resistor R11.

Since the cross coupling potentials C1 and C0 depend on a number of parameters which are subject to scatter, temperature and supply influences, it is difficult or even impossible to find the current reference potential.

In the conventional circuit according to FIG. 1, an attempt is made to circumvent these difficulties by providing a potential difference as large as possible between the potentials C0 and C1. However, this procedure has several disadvantages, noted below.

1. The magnitude of the bit-line excursions is several hundred mW. This leads to an increase of the access time since the charge reversal of the line which is heavily loaded capacitively, takes time.

2. In the transition region (change of address), where two cells relieve each other, the currents through the read transistors TL1 and TL2 are zero, or of the same magnitude, and the read signal UL is therefore not unambiguous.

3. Accurate tolerance calculations and possibly several setting attempts by reconstruction are necessary in order to develop producible memory modules.

4. The full bit-line current IB0 or IB1, respectively, flows into the cell which is constructed from minimum-size structures in order to save space, causing it to overload.

Figure 2:
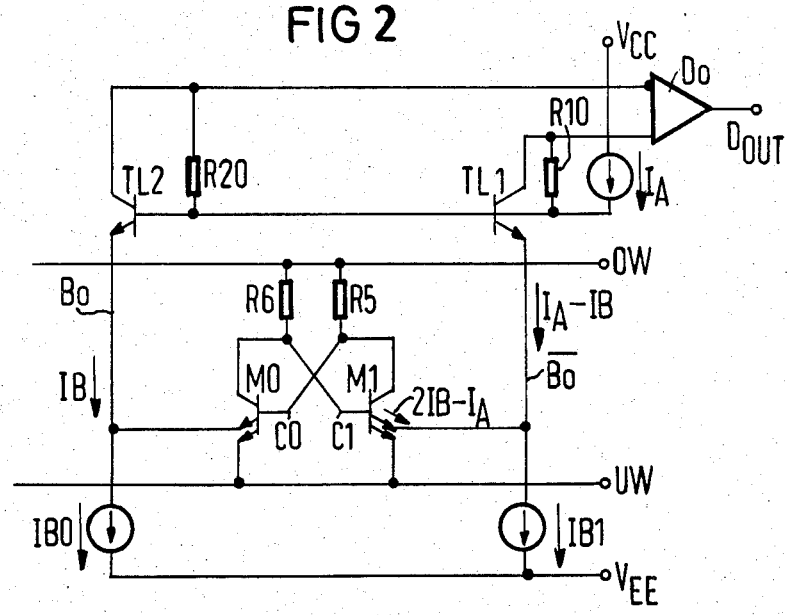
FIG. 2 is a circuit diagram of the basic circuit for the information interrogation of a cell embedded in a memory matrix of a circuit configuration according to the invention.

All these disadvantages can be counteracted according to the invention by providing an interrogation circuit which operates differentially. Such a circuit with a storage cell embedded into a non-illustrated memory matrix, is shown in FIG. 2. The circuit according to FIG. 2 differs from that according to FIG. 1 in that the base electrodes of the read transistors TL1 and TL2 are not addressed by a reference voltage VR as in FIG. 1, but instead are connected to a read-current source IA which is supplied from the second potential or supply voltage $V_{cc}$. Respective collector resistors R20 and R10 of the read transistors TL2 and TL1 are connected between the base and the collector of the respective transistors.

In this circuit, the base electrodes of the read transistors TL1 and TL2 are no longer tied to a fixed potential VR; instead, the interrogation circuit "floats". The interrogation circuit is acted upon by three current sources, namely the bit-line current sources IB0 and IB1 and the read-current source IA, which are of such a nature that their sum current remains positive. The read transistors form diode paths connected between the read-current source and the bit lines.

If, for instance, the current sources IB0 and IB1 have a magnitude of IB and the current of the current source IA has a magnitude of 1.6 IB, then the balance of the current sum requires a residual current of −0.4 IB to come from another source. In the circuit according to FIG. 2, the remaining current closes the circuit from the cell having the higher of the two cross-coupling potentials C0 and C1 at the base of the transistor thereof. If, for instance, the potential C1 at the base of the transistor M1 is higher than the potential C0 at the base of the transistor M0 a residual current of 0.4 IB (2×IB−IA) flows through the emitter of the transistors M1, connected to the bit line $\overline{Bo}$.

The remaining current therefore always flows through the multi-emitter transistor which has a base potential that is higher than the base potential of the other multi-emitter transistor. For this reason, only the magnitude of the base potentials relative to each other is essential for interrogating the cell, and the potential of the base of the read transistors TL1 and TL2 therefore follows the higher cross-coupling potential C0 or C1, respectively.

The current of the current source IA is chosen to be between 0.5-times and equal to the sum of the currents of the bit-line current sources IB0 and IB1. If, for instance, the currents of the bit-line current sources IB1 and IB0 are 1 mA and the current in the read current source IA is 1.5 mA, and if the potential C1 is higher than the potential C0, then a residual current of 0.5 mA flows through the emitter of the transistor M1, connected through the bit-line $\overline{Bo}$ to the upper word line OW. The current in the bit-line $\overline{Bo}$ 0.5 mA and the current in the bit-line Bo is 1 mA, so that a current of 1 mA flows through the read resistor R20 and a current of 0.5 mA flows through the read resistor R10. Different voltages therefore drop across the read resistors and can thus be evaluated by the differential amplifier Do.

Since the potential at the base electrodes of the read transistors TL1 and TL2 follows the higher cross-coupling potential of a storage element, the above-mentioned disadvantages 1-3 disappear. As in the circuit according to FIG. 1, the read current in the circuit of FIG. 2 is also equal to the current flowing through the cell, but the bit-line current IB can be larger in this case than the cell current, for instance, it may be 2½ times the cell current. This considerably facilitates the charge reversal of the bit lines.

Figure 3:
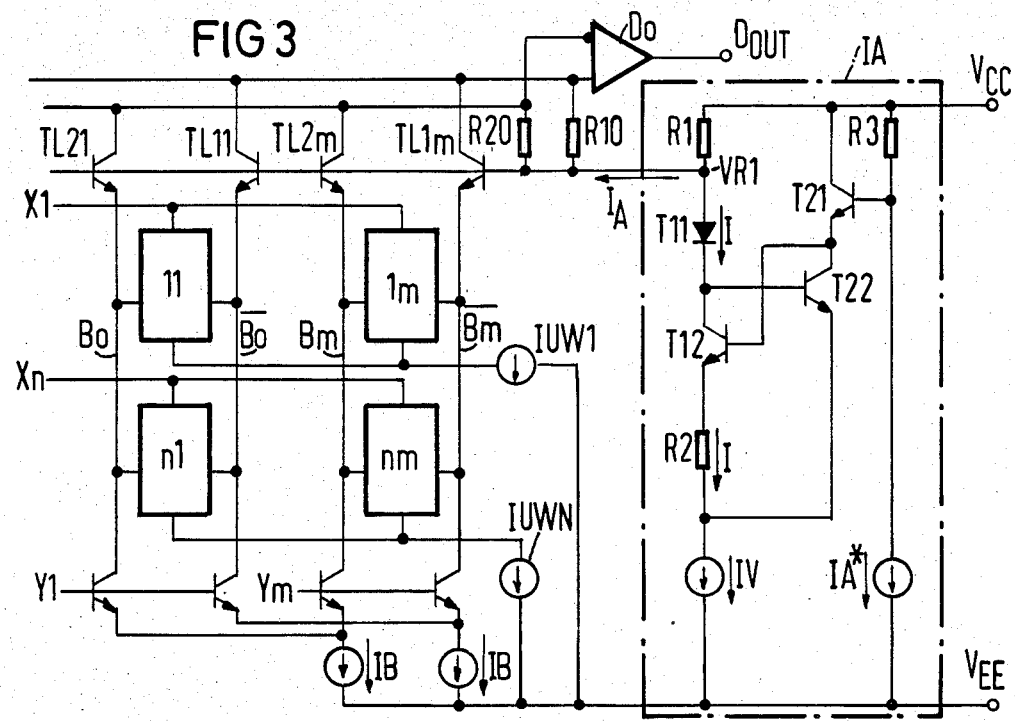
FIG. 3 is a circuit diagram of a circuit configuration according to the invention with a memory having several bit line pairs and a read current source which can be used advantageously.

FIG. 3 illustrates a further circuit for an embodiment according to the invention with several bit-line pairs and a storage panel, reduced to four circuit elements for reasons of clarity. The FIG. 3 circuit includes storage elements 11 and 1m in an upper matrix line having a common upper-word line X1 and a common lower-word line connected through a current source IUW1 to the first potential $V_{EE}$. The lower line of the memory matrix is formed of storage elements n1 and nm and has a common upper-word line Xn and common lower word line which is connected through a current source IUWN to the first potential $V_{EE}$.

Complementary bit-lines Bo and $\overline{Bo}$ as well as Bm and $\overline{Bm}$, which are used in common for each respective memory column (elements 11 and n1 as well as 1m and nm, respectively) are connected through respective selection switches Y1 and Ym and through bit-line current sources IB, already described in connection with FIG. 2, to the first potential $V_{EE}$, and the complementary bit-lines are also connected through respective read transistors TL21, TL11 and TL2m, TL1m, to the inputs of the differential amplifier Do. The connection is formed in such a way that the bit-lines Bo and Bm address one input of the differential amplifier Do through the read transistors, and the complementary bit-lines $\overline{Bo}$ and $\overline{Bm}$, address the other input of the differential amplifier Do through the read transistors. The base electrodes of all of the read transistors TL21, TL11, TL2m, TL1m, are connected to the read-current source IA, which is shown as a dot-dash box. The base electrodes of the read transistors TL21 and TL2m (which are connected to the non-complementary bit-lines $\overline{Bo}$ and $\overline{Bm}$) are connected through the resistor R20 to their collectors, while the base electrodes of the read transistors TL11 and TL1m (connected to the complementary bit-lines $\overline{Bo}$ and $\overline{Bm}$) are connected to their collectors through the resistor R10.

Customary current sources in an emitter circuit with negative current feedback are suitable for use as the constant current sources IB, IUWN, IUW1 which are referred to a lower potential ($V_{EE}$ negative), (see, for instance, the publication by U. Tietze and Ch. Schenk, entitled Halbleiter-Schaltungstechnik (Semiconductor Circuit Design), 5th Edition, Springer Verlag Berlin, Heidelberg, New York, 1980, Pages 53 and 54). A differential amplifier with a high common-mode rejection ratio of customary design, can be used as the read amplifier Do.

If a complementary transistor is not available as the read-current source IA, in particular because of manufacturing reasons, the current source circuit shown in FIG. 3 in the dash-dot box IA, which is addressed by a high potential ($V_{CC}$ positive), can be used to advantage.

The current-source circuit IA is a series circuit, connected between the second potential $V_{CC}$ and the first potential $V_{EE}$. The series circuit is formed of a first resistor R1, a diode T11, the collector-emitter path of a first transistor T12, a second resistor R2 and a first constant-current source IV, wherein the first constant-current source IV is connected to the first potential $V_{EE}$. Further provided between the second potential $V_{CC}$ and the first potential $V_{EE}$, is a series circuit of a third resistor R3 and a second constant-current source IA*, wherein the second constant-current source IA* is connected to the first potential $V_{EE}$. A second transistor T21, has a collector connected to the second potential $V_{CC}$, an emitter connected to the base of the first transistor T12 and a base connected to a junction point between the third resistor R3 and the second constant-current source IA*. To complete the current-source circuit, a third transistor T22 has a collector connected to the emitter of the second transistor T21, an emitter connected to a junction point between the second resistor R2 and the first constant-current source IV, and a base connected to a junction point between the diode T11 and the collector of the first transistor T12. The read current $I_A$ can be taken off at the junction point between the first resistor R1 and the diode T11. Transistors of the same conduction or conductivity type are used for the transistors. The constant-current sources IV and IA* can be constructed in a manner corresponding to the current sources IB.

For the current source circuit constructed in this manner, with R1=R2=R3=R, VR1=junction point between R1 and T11, UBE(Tn)=base-emitter voltage of the transistor Tn, and I=current through T11 and R2, we have:

$$I_A*R + UBE(T21) + UBE(T12) + IR = VR1 + UBE(T11) + UBE(T22)$$

Since T11 and T12 as well as T21 and T22 each carry the same current, we have

UBE(T11)=UBE (T12) and

UBE(T21)=UBE (T22)

With $I_A + I = VR1/R$, we then have $I_A = I_A*$.

$I_A$ is therefore independent of VR1, i.e. an impressed current source.

This applies for $0 > VR1 > -IV \cdot R$.

Figure 4:
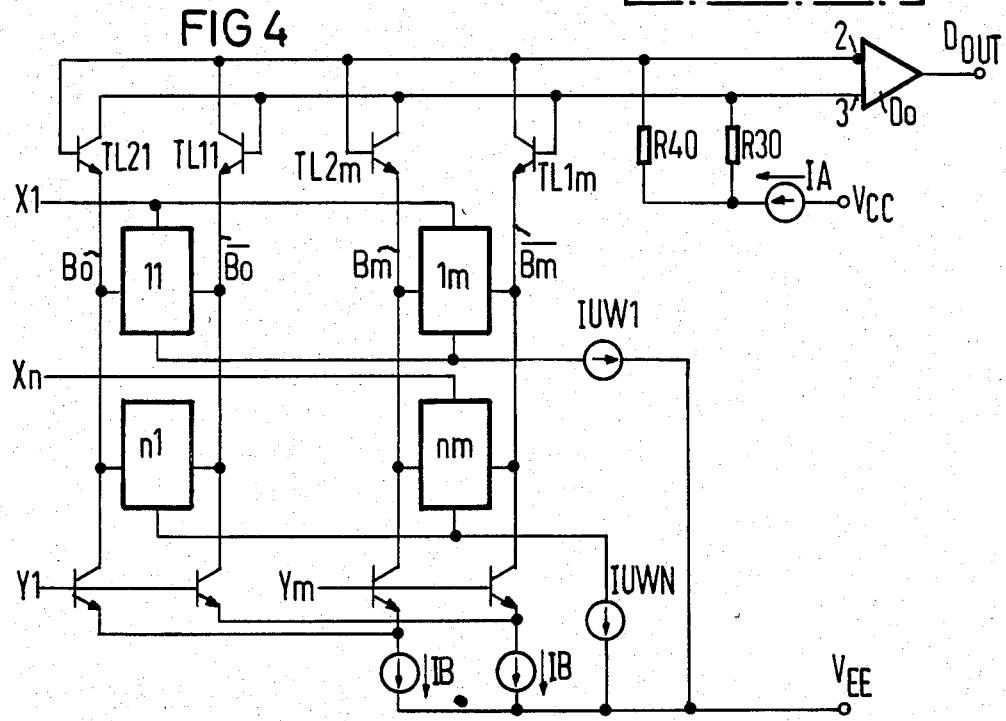
FIG. 4 is a further circuit diagram of a circuit configuration according to the invention in which only two buses are required.

A further embodiment of a circuit according to the invention is shown in FIG. 4, in which four storage elements 11, n1, 1m and nm are provided according to FIG. 3. In this embodiment, the base electrodes of the read transistors TL21 and TL2m (connected to the non-complementary bit lines Bo and Bm) are connected to the inverting first input 2 of the read amplifier Do, while the collector electrodes of these transistors TL21 and TL2m are connected to the second input 3 of the read amplifier Do. The base electrodes of the read transistors TL11 and TL1m (connected to the complementary bit lines $\overline{Bo}$ and $\overline{Bm}$) are connected to the second input 3 of the read amplifier Do, while the collectors of these transistors TL11 and TL1m are connected to the first input 2 of the read amplifier Do.

The read-current source IA, acted upon by the second potential $V_{CC}$, is connected through a first resistor R30 to the second input 3 of the read amplifier Do, while it is connected to the first input 2 of the read amplifier Do through a second read resistor R40.

With this circuit, in which the resistors disposed in the collector circuit of the read transistors are brought to the current source, two buses, i.e. lines required for all memory columns, are sufficient. This circuit requires somewhat larger bit-line excursions than the circuit according to FIG. 3, but in turn has a higher margin of safety for interference.

The foregoing is a description corresponding in substance to German Application Pat. No. 32 27 121.2, dated July 20, 1982, the International priority of which is being claimed for the instant application, and which is hereby made part of this application. Any material discrepancies between the foregoing specification and the aforementioned corresponding German application are to be resolved in favor of the latter.

I claim:

1. Circuit for reading bipolar storage cell, comprising a storage element formed of two fed-back inverters, an upper and a lower word line, each of said inverters being formed of a multi-emitter transistor, each having a first and second emitter, and a load element connected between the upper word line and the collector of a respective one of said multi-emitter transistors, two complementary bit-lines each being connected to the first emitter of a respective one of said multi-emitter transistors, the second emitter being connected to said lower word line, a first potential source, two bit-line current sources each being connected between said first potential source and a respective one of said complementary bit lines, a differential amplifier having two inputs, two read transistors each having a collector-emitter path connected between a respective one of said inputs of said differential amplifier and a respective one of said complementary bit-lines, a second potential source, a read-current source connected between the base of said read transistors and said second potential source, and two resistance elements each being connected between the collector of a respective one of said read transistors and said read current source.

2. Circuit according to claim 1, wherein $0.5 \times I < I_A < I$, wherein $I_A$ as the current of the read current source, and I is the sum of the currents of the bit-line current sources.

3. Circuit according to claim 1, wherein said read-current source includes:

a first series circuit of a first resistor connected to said second potential source, a diode, the collector-emitter path of a first transistor, a second resistor, and a first constant-current-source connected to said first potential source;

a second series circuit of a third resistor connected to said second potential source, and a second constant-current-source connected to said first potential source;

a second transistor having a collector terminal connected to said second potential source, an emitter terminal connected to the base terminal of said first transistor, and a base terminal connected to a junction point between said third resistor and said second constant-current source; and a third transistor having a collector terminal connected to the emitter terminal of said second transistor, an emitter terminal connected to a junction point between said second resistor and said first constant-current-source, and a base terminal connected to a junction point between said diode and the collector terminal of said first transistor said first resistor and said diode having a junction point therebetween forming a read-current output of said read-current source; and said first, second and third transistors all having the same conductivity type.

* * * * *